United States Patent
Han et al.

(10) Patent No.: US 10,446,782 B1
(45) Date of Patent: Oct. 15, 2019

(54) QUANTUM DOT DEVICE AND ELECTRONIC DEVICE

(71) Applicant: SAMSUNG ELECTRONICS CO., LTD., Suwon-si, Gyeonggi-do (KR)

(72) Inventors: Moon Gyu Han, Suwon-si (KR); Dae Young Chung, Suwon-si (KR); Hongkyu Seo, Anyang-si (KR); Kwanghee Kim, Seoul (KR); Kun Su Park, Seongnam-si (KR); Sujin Park, Seoul (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/104,967

(22) Filed: Aug. 20, 2018

(30) Foreign Application Priority Data

Apr. 12, 2018 (KR) .................. 10-2018-0042875

(51) Int. Cl.
*H01L 51/50* (2006.01)
*H01L 51/00* (2006.01)
*H01L 51/56* (2006.01)

(52) U.S. Cl.
CPC ........ *H01L 51/502* (2013.01); *H01L 51/0007* (2013.01); *H01L 51/0037* (2013.01); *H01L 51/0079* (2013.01); *H01L 51/0092* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/56* (2013.01)

(58) Field of Classification Search
CPC ...................................... H01L 51/502
USPC ............................................ 257/13
See application file for complete search history.

(56) References Cited

U.S. PATENT DOCUMENTS

| | | | | |
|---|---|---|---|---|
| 5,929,177 A | * | 7/1999 | Kataoka | A61K 9/1075 424/501 |
| 6,984,842 B1 | * | 1/2006 | Nayfeh | B82Y 10/00 257/14 |

(Continued)

FOREIGN PATENT DOCUMENTS

| CN | 105185918 A | 12/2015 |
|---|---|---|
| KR | 20130020345 A | 2/2013 |

(Continued)

OTHER PUBLICATIONS

Jordi Aguilera-Sigalat et al., "Fluorescence enhancement of amine-capped CdSe/ZnS quantum dots by thiol addition", Canadian Journal of Chemistry, Feb. 25, 2011, pp. 359-363, vol. 89.

*Primary Examiner* — Jami Valentine Miller
(74) *Attorney, Agent, or Firm* — Cantor Colburn LLP

(57) ABSTRACT

A quantum dot device includes a first electrode and a second electrode facing each other, a quantum dot layer disposed between the first electrode and the second electrode and comprising a plurality of quantum dots, a first charge auxiliary layer disposed between the first electrode and the quantum dot layer and contacting the quantum dot layer, and a second charge auxiliary layer disposed between the second electrode and the quantum dot layer and contacting the quantum dot layer, wherein the plurality of quantum dots includes a quantum dot including an organic ligand on a surface thereof, the organic ligand including a hydrophilic functional group at a terminal end.

20 Claims, 1 Drawing Sheet

(56) References Cited

U.S. PATENT DOCUMENTS

| | | | |
|---|---|---|---|
| 9,287,424 B2* | 3/2016 | Win | ............... H01L 31/056 |
| 2006/0208223 A1 | 9/2006 | Chen et al. | |
| 2009/0110642 A1* | 4/2009 | Woo | ............ A61K 49/0052 |
| | | | 424/9.32 |
| 2015/0072092 A1 | 3/2015 | Seo et al. | |
| 2016/0233447 A1 | 8/2016 | Kim et al. | |
| 2018/0062030 A1* | 3/2018 | Chung | ............. H01L 51/5215 |

FOREIGN PATENT DOCUMENTS

| | | |
|---|---|---|
| KR | 20130062966 A | 6/2013 |
| KR | 20160040048 A | 4/2016 |
| KR | 20160061267 A | 5/2016 |
| KR | 20170071255 A | 6/2017 |
| KR | 20170082680 A | 7/2017 |

* cited by examiner

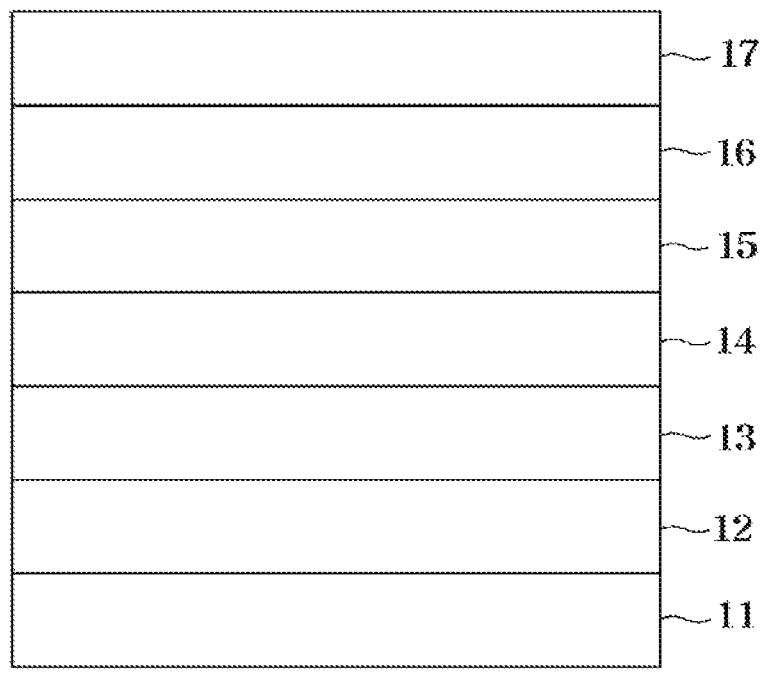

QUANTUM DOT DEVICE AND ELECTRONIC DEVICE

CROSS-REFERENCE TO RELATED APPLICATION

This application claims priority to and the benefit of Korean Patent Application No. 10-2018-0042875 filed in the Korean Intellectual Property Office on Apr. 12, 2018, and all the benefits accruing therefrom under 35 U.S.C. § 119, the entire content of which is incorporated herein by reference.

BACKGROUND

1. Field

A quantum dot device and an electronic device are disclosed.

2. Description of the Related Art

Physical characteristics (e.g., energy bandgaps, melting points, or the like) of nanoparticles are intrinsic properties and may be controlled by changing particle size, and this is unlike bulk materials. For example, semiconductor nanocrystals, also known as quantum dots, which are supplied with photoenergy or electrical energy may emit light in a wavelength region corresponding to the sizes of the quantum dots. Accordingly, the quantum dots may be used as a light emitting element for emitting light of a particular wavelength region.

There is an interest in quantum dot devices, which are electronic devices that use quantum dots as a light emitting element. However, because the quantum dots are different from conventional light emitting elements used for electronic devices, there remains a need for methods for improving performance of the quantum dots and the corresponding quantum dot devices.

SUMMARY

An embodiment is related to a quantum dot device capable of achieving improved performance.

Another embodiment provides an electronic device including the quantum dot device.

In an embodiment, a quantum dot device includes a first electrode and a second electrode facing each other, a quantum dot layer disposed between the first electrode and the second electrode and including a plurality of quantum dots, a first charge auxiliary layer disposed between the first electrode and the quantum dot layer and contacting the quantum dot layer, and a second charge auxiliary layer disposed between the second electrode and the quantum dot layer and contacting the quantum dot layer, wherein the plurality of quantum dots includes a quantum dot including an organic ligand on a surface thereof, the organic ligand including a hydrophilic functional group at a terminal end.

The hydrophilic functional group may include a hydroxyl group, an amino group, a carbonyl group, a carboxylic acid group or a salt thereof, a sulfhydryl group, a phosphoric acid group or a salt thereof, or a combination thereof.

The organic ligand may be represented by Chemical Formula 1.

$$*-M-(L-X)_n \quad \text{Chemical Formula 1}$$

In Chemical Formula 1,

M is a moiety coordination-bonded with the quantum dot, each L is the same or different, and is a substituted or unsubstituted C1 to C30 linear or branched alkylene group, a substituted or unsubstituted C2 to C30 linear or branched alkenylene group, a substituted or unsubstituted C2 to C30 linear or branched alkynylene group, or a combination thereof, each X is the same or different, and is a hydrophilic functional group comprising a hydroxyl group, an amino group, a carbonyl group, a carboxylic acid group or a salt thereof, a sulfhydryl group, or a phosphoric acid group or a salt thereof, n is an integer ranging from 1 to 3, and

* is a bonding point with the quantum dot.

The M of Chemical Formula 1 may be a moiety derived from SH, COOH, COO, $NH_2$, NH, N, $H_2PO$, HPO, PO, $H_2P$, HP, P, OH, $PO(OH)_2$, POOH, or a combination thereof.

The organic ligand may include a substituted or unsubstituted organic ligand that includes a substituted or unsubstituted mercaptomethanol, a substituted or unsubstituted mercaptoethanol, a substituted or unsubstituted mercaptopropanol, a substituted or unsubstituted mercaptobutanol, a substituted or unsubstituted mercaptopentanol, a substituted or unsubstituted mercaptohexanol, a substituted or unsubstituted mercaptoheptanol, a substituted or unsubstituted mercaptooctanol, a substituted or unsubstituted mercaptononanol, a substituted or unsubstituted mercaptodecanol, a substituted or unsubstituted mercaptoundecanol, a substituted or unsubstituted mercaptododecanol, a substituted or unsubstituted mercaptotridecanol, a substituted or unsubstituted mercaptoethane diol, a substituted or unsubstituted mercaptopropane diol, a substituted or unsubstituted mercaptobutane diol, a substituted or unsubstituted mercaptopentane diol, or a combination thereof, wherein at least one hydrogen of the substituted organic ligand is substituted by a C1 to C10 alkyl group.

An average surface roughness of the quantum dot layer may be less than or equal to about 4 nanometers.

The first charge auxiliary layer may include a hole transport material, an electron blocking material, or a combination thereof, and wherein the hole transport material and the electron blocking material are each independently dispersible or soluble in a hydrophobic solvent.

The second charge auxiliary layer may include an electron transport material that is dispersible in a hydrophobic solvent.

The electron transport material may include a low molecular weight organic compound, a polymer, an inorganic material, or a combination thereof. The quantum dot device may further include a first charge injection layer disposed between the first electrode and the first charge auxiliary layer.

The quantum dot device may further include a second charge injection layer disposed between the second electrode and the second charge auxiliary layer.

The first charge auxiliary layer may be a hole transport layer, an electron blocking layer, or a combination thereof; and the second charge auxiliary layer may be an electron transport layer.

In another embodiment, a method of manufacturing a quantum dot device includes forming a first electrode, forming a first charge auxiliary layer on the first electrode, forming a quantum dot layer on the first charge auxiliary layer, forming a second charge auxiliary layer on the quantum dot layer, and forming a second electrode on the second charge auxiliary layer, wherein the forming of the quantum dot layer includes coating a quantum dot solution on a surface of the first charge auxiliary layer, the quantum dot solution including a quantum dot comprising an organic ligand on a surface thereof, the organic ligand including a hydrophilic functional group at a terminal end; and a hydrophilic solvent.

The hydrophilic functional group may be a hydroxyl group, an amino group, a carbonyl group, a carboxylic acid group, or a salt thereof, a sulfhydryl group, a phosphoric acid group or a salt thereof, or a combination thereof.

The hydrophilic solvent may be a solvent having a polarity index of greater than or equal to about 5.0.

The hydrophilic solvent may include water, alcohol, acetonitrile, dimethyl formamide, or a combination thereof.

The forming of the first charge auxiliary layer may include coating a first charge auxiliary solution on a surface of the first electrode, wherein the first charge auxiliary solution includes a hydrophobic solvent; and a hole transport material, an electron blocking material, or a combination thereof, wherein the hole transport material and the electron blocking material are each independently dispersible or soluble in the hydrophobic solvent.

The hydrophobic solvent may include hexane, diethyl ether, methylene chloride, benzene, toluene, xylene, chloroform, octane, nonane, cyclohexane, acetone, or a combination thereof.

The forming of the second charge auxiliary layer may include coating a second charge auxiliary solution on a surface of the quantum dot layer, wherein the second charge auxiliary solution includes a hydrophobic solvent; and an electron transport material that is dispersible or soluble in the hydrophobic solvent.

The hydrophobic solvent may include hexane, diethyl ether, methylene chloride, benzene, toluene, xylene, chloroform, octane, nonane, cyclohexane, acetone, or a combination thereof.

In still another embodiment, an electronic device including the quantum dot device is provided.

Performance of the quantum dot device may be improved.

BRIEF DESCRIPTION OF THE DRAWING

These and/or other aspects will become apparent and more readily appreciated from the following description of the embodiments, taken in conjunction with the accompanying drawing, in which:

FIG. 1 is a schematic cross-sectional view of a quantum dot device according to an embodiment.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

Accordingly, the embodiments are merely described below, by referring to the FIGURES, to explain aspects of the present description. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Combination" as used herein is inclusive of all types of combinations, including blends, alloys, solutions, and the like.

Furthermore, relative terms, such as "lower" or "bottom" and "upper" or "top," may be used herein to describe one element's relationship to another element as illustrated in the FIGURES. It will be understood that relative terms are intended to encompass different orientations of the device in addition to the orientation depicted in the FIGURES. For example, if the device in one of the FIGURES is turned over, elements described as being on the "lower" side of other elements would then be oriented on "upper" sides of the other elements. The exemplary term "lower," can therefore, encompasses both an orientation of "lower" and "upper,"

depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

As used herein, when a definition is not otherwise provided, the term "substituted" refers to a compound or a group or a moiety wherein at least one of the hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br or —I), a hydroxy group (—OH), a nitro group (—NO$_2$), a cyano group (—CN), an amino group (—NRR', wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, when a definition is not otherwise provided, the term "hetero" refers to a group or fragment including 1 to 3 heteroatoms such as N, O, S, Si, and P.

As used herein, when a definition is not otherwise provided, the term "alkyl group" refers to a group derived from a straight or branched chain saturated aliphatic hydrocarbon having the specified number of carbon atoms and having a valence of at least one.

As used herein, when a definition is not otherwise provided, the term "alkoxy group" refers to "alkyl-O—", wherein the term "alkyl" has the same meaning as described above.

As used herein, when a definition is not otherwise provided, the term "alkenyl group" refers to a straight or branched chain, monovalent hydrocarbon group having at least one carbon-carbon double bond.

As used herein, when a definition is not otherwise provided, the term "alkynyl group" refers to a straight or branched chain, monovalent hydrocarbon group having at least one carbon-carbon triple bond.

As used herein, when specific definition is not otherwise provided, the term "cycloalkynyl group" refers to a monovalent group having one or more rings and one or more carbon-carbon triple bond in the ring, wherein all ring members are carbon.

As used herein, when specific definition is not otherwise provided, the term "acyl group" refers to "alkyl-C(=O)—", wherein the term "alkyl" has the same meaning as described above.

As used herein, when a definition is not otherwise provided, the term "heterocycloalkyl group" refers to a cycloalkyl group as defined above, wherein 1 to 3 carbon atoms are replaced with heteroatoms such as N, O, S, Si, and P.

As used herein, when a definition is not otherwise provided, the term "aryl", which is used alone or in combination, refers to an aromatic hydrocarbon group containing at least one ring and having the specified number of carbon atoms. The term "aryl" may be construed as including a group with an aromatic ring fused to at least one cycloalkyl ring.

As used herein, when a definition is not otherwise provided, the term "heteroaryl group" refers to an aryl group including carbon and 1 to 3 heteroatoms such as N, O, S, and P as ring atoms.

As used herein, when a definition is not otherwise provided, the term "arylalkyl group" refers to a substituted or unsubstituted aryl group covalently linked to an alkyl group that is linked to a compound.

As used herein, when a definition is not otherwise provided, the term "alkylene group" refers to a straight or branched saturated aliphatic hydrocarbon group having a valence of at least two, optionally substituted with one or more substituents.

As used herein, the term "alkenylene group" may refer to a straight or branched aliphatic hydrocarbon group having a valence of at least two, having at least one carbon-carbon double bond, optionally substituted with one or more substituents where indicated, provided that the valence of the alkenylene group is not exceeded.

As used herein, the term "alkynylene group" may refer to a straight or branched aliphatic hydrocarbon group having a valence of at least two, having at least one carbon-carbon triple bond, optionally substituted with one or more substituents where indicated, provided that the valence of the alkynylene group is not exceeded.

As used herein, when a definition is not otherwise provided, the term "cycloalkylene group" refers to a cyclic hydrocarbon group having a valence of at least two, optionally substituted with one or more substituents where indicated, provided that the valence of the cycloalkylene group is not exceeded. As used herein, when a definition is not otherwise provided, the term "arylene group" refers to a functional group having a valence of at least two obtained by removal of at least two hydrogens in an aromatic ring, optionally substituted with one or more substituents where indicated, provided that the valence of the arylene group is not exceeded.

As used herein, when a definition is not otherwise provided, the term "heteroarylene group" refers to a functional group having a valence of at least two obtained by removal of two hydrogens in an aromatic ring, containing one to three heteroatoms such as N, O, S, Si, and P as ring-forming elements, optionally substituted with one or more substituents where indicated, provided that the valence of the heteroarylene group is not exceeded.

As used herein, the term "hydroxy group" refers to —OH.

As used herein, when a definition is not otherwise provided, the term "amino group" refers to —NRR', wherein R and R' are each independently hydrogen or a C1 to C6 alkyl group.

As used herein, when a definition is not otherwise provided, the term "carbonyl group" refers to an acyl group (alkyl-C(=O)—, wherein the term "alkyl" has the same meaning as described above), an aldehyde group (—C(=O)H), a carbamoyl group (—C(O)NH$_2$), an ester group (—C(=O)OR, wherein R is a C1 to C6 alkyl group or a C6 to C12 aryl group), or a combination thereof.

As used herein, when a definition is not otherwise provided, the term "carboxylic acid group or a salt thereof" refers to —COOH and —C(=O)OM, wherein M is an organic or inorganic cation.

As used herein, when a definition is not otherwise provided, the term "phosphoric acid group or a salt thereof" refers to —$PO_3H_2$, —$PO_3MH$, and —$PO_3M_2$, wherein M is an organic or inorganic cation.

As used herein, when a definition is not otherwise provided, the term "dispersion" refers to a dispersion, wherein a dispersed phase is a solid and a continuous phase includes a liquid. For example, the term "dispersion" may refer to a colloidal dispersion wherein the dissolved or dispersed phase has a dimension of about 1 nm to about several micrometers (pm) (e.g., 1 μm or less, 2 μm or less, or 3 μm or less).

As used herein, when a definition is not otherwise provided, the term "Group" in the term Group III, Group II, and the like refers to a group of Periodic Table.

As used herein, when a definition is not otherwise provided, "Group III" refers to Group IIIA and Group IIIB, and examples of Group III metal may be Al, In, Ga, and TI, but are not limited thereto.

As used herein, when a definition is not otherwise provided, "Group IV" refers to Group IVA and Group IVB, and examples of a Group IV metal may be Si, Ge, and Sn, but are not limited thereto. As used herein, the term "metal" may include a semi-metal such as Si.

As used herein, when a definition is not otherwise provided, "Group I" refers to Group IA and Group IB, and examples may include Li, Na, K, Rb, and Cs, but are not limited thereto.

As used herein, when a definition is not otherwise provided, "Group V" refers to Group VA, and examples may include N, P, As, Sb, and Bi, but are not limited thereto.

As used herein, when a definition is not otherwise provided, "Group VI" refers to Group VIA, and examples may include S, Se, and Te, but are not limited thereto.

As used herein, when a definition is not otherwise provided, "a low molecular weight organic compound" may have a molecular weight of less than or equal to about 900 grams per mole (g/mol).

Hereinafter, a work function (WF), a highest occupied molecular orbital (HOMO) energy level, and a lowest unoccupied molecular orbital (LUMO) energy level are expressed as an absolute value from a vacuum energy level (i.e., 0 electron volts (eV)). In addition, when the work function, HOMO energy level, or LUMO energy level is said to be 'deep,' 'high,' or 'large,' the work function or HOMO energy level has a larger absolute value from the vacuum energy level (0 eV), while when the work function, HOMO energy level, or LUMO energy level is 'shallow,' low,' or 'small,' the work function or HOMO energy level has a smaller absolute value from the vacuum energy level (0 eV).

Hereinafter, a quantum dot device according to an embodiment is described with reference to the drawing.

FIG. 1 is a schematic cross-sectional view of a quantum dot device according to an embodiment.

Referring to FIG. 1, a quantum dot device 10 according to an embodiment includes an anode 11, a hole injection layer 12 disposed on the anode 11, a hole auxiliary layer 13 disposed on the hole injection layer 12, a quantum dot layer 14 disposed on the hole auxiliary layer 13, an electron auxiliary layer 15 disposed on the quantum dot layer 14, an electron injection layer 16 disposed on the electron auxiliary layer 15, and a cathode 17 disposed on the electron injection layer 16.

A substrate (not shown) may be disposed on a surface of the anode 11 or the cathode 17. The substrate may be for example made of an inorganic material such as glass; an organic material such as polycarbonate, poly(methyl methacrylate), poly(ethylene terephthalate), poly(ethylene naphthalate), polyamide, poly(ether sulfone), or a combination thereof; or a silicon wafer.

The anode 11 may be made of a conductor having a relatively large work function to enhance hole injection, and may be for example a metal, a conductive metal oxide, or a combination thereof. The anode 11 may be for example made of a metal or an alloy thereof such as nickel, platinum, vanadium, chromium, copper, zinc, or gold; a conductive metal oxide such as zinc oxide (ZnO), indium oxide ($In_2O_3$), tin oxide, indium tin oxide (ITO), indium zinc oxide (IZO), or a fluorine-doped tin oxide; or a combination of metal and oxide such as ZnO and Al, or $SnO_2$ and Sb, but is not limited thereto.

The cathode 17 may be for example made of a conductor having relatively low work function conductor to help electron injection and may be for example made of a metal, a conductive metal oxide, and/or a conductive polymer. The cathode 17 may be for example a metal or an alloy thereof such as magnesium, calcium, sodium, potassium, titanium, indium, yttrium, lithium, gadolinium, aluminum silver, tin, lead, cesium, or barium; a multi-layer structure material such as LiF/Al, $LiO_2$/Al, LiF/Ca, Liq/Al, and $BaF_2$/Ca, but is not limited thereto. As used herein, "Liq" refers to lithium-8-hydroxy-quinolinolate At least one of the anode 11 and the cathode 17 may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When at least one of the anode 11 and the cathode 17 is a non-light-transmitting electrode, it may be made of for example an opaque conductor such as aluminum (Al), silver (Ag), or gold (Au).

The hole injection layer 12 may be disposed between the anode 11 and the quantum dot layer 14 and may contact, for example directly contact, the anode 11. The hole injection layer 12 may include for example a conductive compound, for example a conductive metal oxide, a conductive monomer, a conductive oligomer, a conductive polymer, a conductive ion compound, or a combination thereof. The hole injection layer 12 may include for example polythiophene, polyaniline, polypyrrole, poly(para-phenylene), polyfluorene, poly(3,4-ethylenedioxythiophene), poly(3,4-ethylenedioxythiophene): poly(styrenesulfonate) (PEDOT:PSS), a derivative thereof, or a combination thereof, but is not limited thereto. The hole injection layer 12 may be omitted in some embodiments.

The hole auxiliary layer 13, which is the first charge auxiliary layer, may be disposed between the hole injection layer 12 and the quantum dot layer 14 and may contact, for example directly contact, the quantum dot layer 14. Holes that are supplied from the anode 11 may be transported to the quantum dot layer 14 through the hole injection layer 12 and the hole auxiliary layer 13.

The hole auxiliary layer 13 may have a monolayer or two or more layers and may be for example a hole transport layer, an electron blocking layer, or a combination thereof.

For example, the hole auxiliary layer 13 may be a hole transport layer.

For example, the hole auxiliary layer 13 may be an electron blocking layer.

For example, the hole auxiliary layer 13 may include a hole transport layer and an electron blocking layer, and for example the hole transport layer may contact the hole injection layer 12 or the anode 11, and the electron blocking layer may contact the quantum dot layer 14.

The hole auxiliary layer 13 may include at least one hole transport material, at least one electron blocking material, or a combination thereof, and when an electric field is applied to the hole transport material, the hole transport material has conductivity characteristics depending on a HOMO energy level, and the electron blocking material has a lower LUMO energy level than that of an adjacent layer and thus may block movement of electrons.

The hole auxiliary layer 13 may have a HOMO energy level between that of the hole injection layer 12 and that of the quantum dot layer 14. For example the HOMO energy level of the hole auxiliary layer 13 may be for example greater than or equal to about 5.4 eV, greater than or equal to about 5.6 eV, or greater than or equal to about 5.8 eV. For example, the HOMO energy level of the hole auxiliary layer 13 may range from about 5.4 eV to about 7.0 eV, for example about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The hole auxiliary layer 13 may include for example an organic compound, an inorganic compound, or a combination thereof, for example a low molecular weight compound, a polymer compound, an inorganic compound, or a combination thereof.

The hole auxiliary layer 13 may be formed as a coating layer on a surface of the first electrode or a surface of the hole injection layer 12 from a solution (hereinafter, referred to as a 'hole auxiliary solution'), and the hole auxiliary solution may include a solvent and a hole transport material, an electron blocking material, or a combination thereof. The solvent may be for example a hydrophobic solvent, for example hexane, diethyl ether, methylene chloride, benzene, toluene, xylene, chloroform, octane, nonane, cyclohexane, acetone, or a combination thereof, but is not limited thereto. The hole transport material and the electron blocking material each may be independently a material that is dispersible or soluble in a hydrophobic solvent, and may be for example poly(9,9-dioctyl-fluorene-co-N-(4-butylphenyl)-diphenylamine) (TFB), poly(aryl amine), poly(N-vinylcarbazole), polyaniline, polypyrrole, N,N,N',N'-tetrakis(4-methoxyphenyl)-benzidine (TPD), 4-bis[N-(1-naphthyl)-N-phenylamino]biphenyl (α-NPD), 4,4',4''-tris[phenyl(m-tolyl)amino]triphenylamine (m-MTDATA), 4,4',4''-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a p-type metal sulfide (e.g., ZnS), a carbonaceous material such as graphene oxide, or a combination thereof, but are not limited thereto.

The quantum dot layer 14 includes a plurality of quantum dots. The quantum dots may be a semiconductor nanocrystal, and may have various shapes, for example an isotropic semiconductor nanocrystal, a quantum rod, and a quantum plate. Herein, the quantum rod may indicate a quantum dot having an aspect ratio of greater than about 1, for example an aspect ratio of greater than or equal to about 2, greater than or equal to about 3, or greater than or equal to about 5. For example, the quantum rod may have an aspect ratio of less than or equal to about 50, of less than or equal to about 30, or of less than or equal to about 20. In an embodiment, the quantum rod may have an aspect ratio of greater than about 1 and less than or equal to about 50.

The quantum dot may have for example an average particle diameter (or an average largest particle dimension for a non-spherical shape) of for example about 1 nanometer (nm) to about 100 nm, about 1 nm to about 80 nm, about 1 nm to about 50 nm, or about 1 nm to 20 nm.

Energy bandgaps of quantum dots may be controlled according to sizes and compositions of the quantum dots, and thus light emitting wavelength may be controlled. For example, as the sizes of quantum dots increase, the quantum dots may have narrow energy bandgaps and thus emit light in a relatively long wavelength region while as the sizes of the quantum dots decrease, the quantum dots may have wider energy bandgap and thus emit light in a relatively shorter wavelength region.

For example, the quantum dot may emit light in a predetermined wavelength region of a visible ray region (e.g., 400 to 700 nm) according to its size and/or composition. For example, the quantum dot may emit blue light, red light, or green light, and the blue light may have for example a peak emission wavelength region of about 430 nm to about 470 nm, the red light may have for example a peak emission wavelength region of about 620 nm to about 660 nm, and the green light may have for example a peak emission wavelength region of about 510 nm to about 550 nm.

The quantum dot may have for example a quantum yield (QY) of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM). Herein, the FWHM is a width of a wavelength region corresponding to half of a maximum peak emission and as the FWHM is narrower, light in a narrower wavelength region may be emitted and higher color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dot may be for example a Group II-VI semiconductor compound, a Group III-V semiconductor compound, a Group IV-VI semiconductor compound, a Group IV semiconductor compound, a Group I-III-VI semiconductor compound, a Group I—II-IV-VI semiconductor compound, a Group II-III-V semiconductor compound, or a combination thereof.

The Group II-VI semiconductor compound may be for example a binary element compound such as CdSe, CdTe, ZnS, ZnSe, ZnTe, ZnO, HgS, HgSe, HgTe, MgSe, MgS, and a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof, but is not limited thereto. The Group II-VI compound may further include a Group III metal.

The Group III-V semiconductor compound may be for example a binary element compound such as GaN, GaP, GaAs, GaSb, AlN, AlP, AlAs, AlSb, InN, InP, InAs, InSb, and a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof, but is not limited thereto. The Group III-V compound may further include a Group II metal such as Zn.

The Group IV-VI semiconductor compound may be for example a binary element compound such as SnS, SnSe, SnTe, PbS, PbSe, PbTe, and a combination thereof; a ternary element compound such as SnSeS, SnSeTe, SnSTe, PbSeS, PbSeTe, PbSTe, SnPbS, SnPbSe, SnPbTe, and a combination thereof; and a quaternary element compound such as SnPbSSe, SnPbSeTe, SnPbSTe, and a combination thereof, but is not limited thereto.

The Group IV semiconductor compound may be for example a singular element semiconductor compound such as Si, Ge, and a combination thereof; and a binary element semiconductor compound such as SiC, SiGe, and a combination thereof, but is not limited thereto.

The Group semiconductor compound may be for example $CuInSe_2$, $CuInS_2$, CuInGaSe, CuInGaS, and a combination thereof, but is not limited thereto.

The Group I-II-IV-VI semiconductor compound may be for example CuZnSnSe and CuZnSnS, but is not limited thereto.

The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or different concentrations within the same particle (e.g., non-uniform concentration/distribution).

For example, the quantum dot may include a non-cadmium-based quantum dot. Cadmium (Cd) may cause environment and health problems and is a restricted element by Restriction of Hazardous Substances Directive (RoHS) in a plurality of countries, and thus the non-cadmium-based quantum dot may be effectively used.

For example, the quantum dot may be for example a semiconductor compound including zinc (Zn), tellurium (Te), and selenium (Se). For example, in the semiconductor compound, a content of tellurium (Te) may be smaller than that of selenium (Se). The semiconductor compound may emit blue light having a peak emission wavelength in a wavelength region of less than or equal to about 470 nm, for example a wavelength region of about 430 nm to 470 nm.

For example, the quantum dot may be for example a semiconductor compound including indium (In), zinc (Zn), and phosphorus (P). For example, in the semiconductor compound, a mole ratio of zinc (Zn) relative to indium (In) may be greater than or equal to about 25:1. The semiconductor compound may emit blue light having a peak emission wavelength in a wavelength region of less than or equal to about 470 nm, for example a wavelength region of about 430 nm to 470 nm.

The quantum dot may have a core-shell structure wherein one quantum dot surrounds another quantum dot, such as a core including a first semiconductor and a shell disposed on at least a portion of the surface of the core and including a second semiconductor having a composition different from the first semiconductor. For example, the core and the shell of the quantum dot may have an interface, and an element of at least one of the core or the shell may be at the interface and may have a concentration gradient wherein the concentration of the element(s) of the shell decreases toward the core. For example, a material composition of the shell of the quantum dot has a higher energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shell layers wherein each shell layer may be independently a single composition, an alloy, and/or the one having a concentration gradient.

For example, a shell layer of a multi-layered shell that is further from the core may have a higher energy bandgap than a shell layer that is nearer to the core, and thereby the quantum dot may exhibit a quantum confinement effect.

For example, the quantum dot having a core-shell structure may for example include a core including a Zn—Te—Se first semiconductor compound including zinc (Zn), tellurium (Te), and selenium (Se) and a shell including a second semiconductor compound disposed on at least a part of the core and having a different composition from that of the core.

The Zn—Te—Se first semiconductor compound may be for example a Zn—Se-based semiconductor compound including a small amount of tellurium (Te), for example, a semiconductor compound represented by $ZnTe_xSe_{1-x}$ (wherein, x is greater than about 0 and less than or equal to about 0.05).

For example, in the Zn—Te—Se first semiconductor compound, the molar amount of zinc (Zn) may be greater than that of selenium (Se), and the molar amount of selenium (Se) may be greater than that of tellurium (Te). For example, in the first semiconductor compound, a mole ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) relative to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1.

The second semiconductor compound may include for example a Group II-VI semiconductor compound, a Group III-V semiconductor compound, a Group IV-VI semiconductor compound, a Group IV semiconductor compound, a Group semiconductor compound, a Group I—II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group semiconductor compound, the Group I—II-IV-VI semiconductor compound, and the Group II-III-V semiconductor compound are the same as described above.

For example, the second semiconductor compound may include zinc (Zn), selenium (Se), and/or sulfur (S). For example, the shell may include at least one internal shell layer disposed nearer to the core and an outermost shell layer disposed at the outermost shell of the quantum dot and the internal shell layer may include ZnSeS and the outermost shell layer may include ZnS. For example, the shell may have a concentration gradient of one component and for example an amount of sulfur (S) in the shell may increase with increasing distance away from the core.

For example, the quantum dot having a core-shell structure may include for example a core including an In—Zn—P-based third semiconductor compound including indium (In), zinc (Zn), and phosphorus (P) and a shell disposed on at least one portion of the core and including a fourth semiconductor compound having a different composition from the core.

In the In—Zn—P-based third semiconductor compound, a mole ratio of zinc (Zn) relative to indium (In) may be greater than or equal to about 25:1. For example, in the In—Zn—P-based third semiconductor compound, the mole ratio of zinc (Zn) relative to indium (In) may be greater than or equal to about 28:1, greater than or equal to about 29:1, or greater than or equal to about 30:1. For example, in the In—Zn—P-based third semiconductor compound, the mole ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the fourth semiconductor compound may include zinc (Zn) and sulfur (S), and optionally selenium (Se). For example, the shell may include at least one internal shell layer disposed nearer to the core and an outermost shell layer disposed at the outermost shell of the quantum dot and at least one of the internal shell layer and the outermost shell layer may include the fourth semiconductor compound of ZnS or ZnSeS.

The surface of the quantum dot may include, for example may be substituted with, an organic ligand. The organic ligand may be coordination-bonded with the surface of the quantum dot (i.e., dative bonding between a lone electron pair of the organic ligand and the quantum dot), and this may enable the quantum dot to be dispersed or dissolved in a solvent to a greater extent, and thus the quantum dot layer may be effectively formed using a quantum dot solution.

The organic ligand may have a hydrophilic functional group at a terminal end. The hydrophilic functional group may be for example a hydroxyl group, an amino group, a carbonyl group, a carboxylic acid group or a salt thereof, a sulfhydryl (—SH) group, and a phosphoric acid group or a salt thereof, or a combination thereof.

The hydrophilic functional group of the organic ligand at the terminal end may assistant a quantum dot to be dispersed or dissolved in a hydrophilic solvent, and thus the quantum dot layer may be effectively formed using a quantum dot solution including a hydrophilic solvent. The hydrophilic solvent may be for example a solvent having a polarity index of greater than or equal to about 5.0, and may include for example water, alcohol, acetonitrile, dimethyl formamide, or a combination thereof, but is not limited thereto.

For example, the organic ligand may be represented by Chemical Formula 1.

$$*\text{-M-(L-X)}_n \qquad \text{Chemical Formula 1}$$

In Chemical Formula 1,

M is a moiety coordination-bonded with the quantum dot, each L is the same or different, and is a substituted or unsubstituted C1 to C30 linear or branched alkylene group, a substituted or unsubstituted C2 to C30 linear or branched alkenylene group, a substituted or unsubstituted C2 to C30 linear or branched alkynylene group, or a combination thereof, each X is the same or different, and is a hydrophilic functional group, n is an integer ranging from 1 to 3, and

* is a bonding point with the quantum dot.

For example, the M of Chemical Formula 1 may be a moiety derived from SH, COOH, COO, $NH_2$, NH, N, $H_2PO$, HPO, PO, $H_2P$, HP, P, OH, $PO(OH)_2$, POOH, or a combination thereof. In an embodiment, the M may be a moiety that is, for example, (L-X)SH, (L-X)COOH, (L-X)C(=O)O-(L-X), (L-X)$NH_2$, (L-X)$_2$NH, (L-X)$_3$N, $H_2P$(=O)(L-X), HP(=O)(L-X)$_2$, P(=O)(L-X)$_3$, $H_2P$(L-X), HP(L-X)$_2$, P(L-X)$_3$, (L-X)OH, $(OH)_2P$(=O)(L-X), (OH)P(=O)(L-X)$_2$, or a combination thereof.

For example, in Chemical Formula 1, X may be a hydroxyl group, an amino group, a carbonyl group, a carboxylic acid group, or a salt thereof, a sulfhydryl group, a phosphoric acid group or a salt thereof, or a combination thereof.

For example, the organic ligand may be a substituted or unsubstituted organic ligand that includes a substituted or unsubstituted mercaptoalcohol, for example substituted or unsubstituted mercaptomethanol, a substituted or unsubstituted mercaptoethanol, a substituted or unsubstituted mercaptopropanol, a substituted or unsubstituted mercaptobutanol, a substituted or unsubstituted mercaptopentanol, a substituted or unsubstituted mercaptohexanol, a substituted or unsubstituted mercaptoheptanol, a substituted or unsubstituted mercaptooctanol, a substituted or unsubstituted mercaptononanol, a substituted or unsubstituted mercaptodecanol, a substituted or unsubstituted mercaptoundecanol, a substituted or unsubstituted mercaptododecanol, a substituted or unsubstituted mercaptotridecanol, a substituted or unsubstituted mercaptoethane diol, a substituted or unsubstituted mercaptopropane diol, a substituted or unsubstituted mercaptobutane diol, a substituted or unsubstituted mercaptopentane diol, or a combination thereof. For example, the organic ligand may include a substituted or unsubstituted 1-mercaptomethanol, a substituted or unsubstituted 2-mercaptoethanol, a substituted or unsubstituted 3-mercaptopropanol, a substituted or unsubstituted 4-mercaptobutanol, a substituted or unsubstituted 5-mercaptopentanol, a substituted or unsubstituted 6-mercaptohexanol, a substituted or unsubstituted 7-mercaptoheptanol, a substituted or unsubstituted 8-mercaptooctanol, a substituted or unsubstituted 9-mercaptononanol, a substituted or unsubstituted 10-mercaptodecanol, a substituted or unsubstituted 11-mercaptoundecanol, a substituted or unsubstituted 12-mercaptododecanol, a substituted or unsubstituted 13-mercaptotridecanol, 3-mercapto-3-methylbutan-1-ol, 2-mercapto-3-butanol, 3-mercapto-1-hexanol, 1-thioglycerol, 4-mercapto-4-methylpentan-2-ol, or a combination thereof. Herein "substituted" refers to replacement of at least one hydrogen of the substituted organic ligand by a C1 to C10 alkyl group.

In this way, the quantum dot layer 14 includes a quantum dot including an organic ligand having a hydrophilic functional group at the terminal end and thereby may be formed using a quantum dot solution in which quantum dots are effectively dispersed or dissolved in a hydrophilic solvent such as water or alcohol. Accordingly, as described above, a quantum dot solution including a hydrophilic solvent may be coated on a surface of the hole auxiliary layer 13, which is previously formed by a hole auxiliary solution including a hydrophobic solvent, to form the quantum dot layer 14 and thereby, the lower hole auxiliary layer 13 may be prevented from being swelled or dissolved by the quantum dot solution during coating of the quantum dot solution, and thus solvent resistance or solvent stability of the hole auxiliary layer 13 and the quantum dot layer 14 may be improved.

The surface of the quantum dot layer 14 may be substantially uniform due to the solvent resistance or solvent stability of the quantum dot layer 14, and for example an average surface roughness (RMS) of the quantum dot layer 14 may be less than or equal to about 4 nm.

The quantum dot layer 14 may have for example a thickness of about 5 nm to 200 nm, about 10 nm to about 100 nm, about 10 nm to about 80 nm, about 10 nm to about 50 nm, or about 25 nm to about 40 nm.

The quantum dot layer 14 may have for example a relatively high HOMO energy level ($HOMO_{QD}$), for example a HOMO energy level ($HOMO_{QD}$) of greater than or equal to about 5.4 eV, greater than or equal to about 5.5 eV, greater than or equal to about 5.6 eV, greater than or equal to about 5.7 eV, greater than or equal to about 5.8 eV, greater than or equal to about 5.9 eV, or greater than or equal to about 6.0 eV. The HOMO energy level ($HOMO_{QD}$) of the quantum dot layer 14 may be, for example, in a range of about 5.4 eV to about 7.0 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, and about 6.0 eV to about 6.2 eV.

The electron auxiliary layer 15, also referred to as the second charge auxiliary layer, may be disposed between the cathode 17 and the quantum dot layer 14 and may contact, for example directly contact, the quantum dot layer 14. The electron auxiliary layer 15 may be for example an electron transport layer. The electron auxiliary layer 15 may include for example an inorganic material, an organic material, an organic/inorganic material, or a combination thereof.

The electron auxiliary layer 15 may include for example an electron transport material that is dispersible in a hydrophobic solvent, for example a low molecular weight organic compound, a polymer, an inorganic material, or a combination thereof that is dispersible in a hydrophobic solvent, for example 1,4,5,8-naphthalene-tetracarboxylic dianhydride (NTCDA), bathocuproine (BCP), tris[3-(3-pyridyl)-mesityl]borane (3TPYMB), LiF, Alq3, Gaq3, Inq3, Znq2, Zn(BTZ)2, BeBq2, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), or a combination thereof, but is not limited thereto.

The hydrophobic solvent may include hexane, diethyl ether, methylene chloride, benzene, toluene, xylene, chloroform, octane, nonane, cyclohexane, acetone, or a combination thereof.

The electron injection layer 16 may be disposed between the cathode 17 and the quantum dot layer 14 and may contact, for example directly contact, the cathode 17. Electrons supplied from the cathode 17 may be transported to the quantum dot layer 14 through the electron injection layer 16 and the electron auxiliary layer 15. The electron injection layer 16 may be omitted as needed.

Hereinafter, a method of manufacturing a quantum dot device according to an embodiment is described with reference to FIG. 1.

A method of manufacturing a quantum dot device according to an embodiment includes forming an anode 11, forming a hole injection layer 12 on the anode 11, forming a hole auxiliary layer 13 on the hole injection layer 12, forming a quantum dot layer 14 on the hole auxiliary layer 13, forming an electron auxiliary layer 15 on the quantum dot layer 14, forming an electron injection layer 16 on the electron auxiliary layer 15, and forming a cathode 17 on the electron injection layer 16.

For example, at least one of the hole injection layer 12, the hole auxiliary layer 13, the quantum dot layer 14, the electron auxiliary layer 15, and the electron injection layer 16 may be formed by a solution process. The solution process may be for example spin coating, slit coating, inkjet coating, bar coating, and the like, but is not limited thereto.

For example, the hole auxiliary layer 13, the quantum dot layer 14, and the electron auxiliary layer 15 may be formed by a solution process, respectively.

For example, the forming of the quantum dot layer 14 may include coating a quantum dot solution on a surface of the hole auxiliary layer (13) and drying the same, wherein the quantum dot solution may be a hydrophilic solution and the quantum dot solution may include a quantum dot including an organic ligand having a hydrophilic functional group and a hydrophilic solvent. The hydrophilic functional group may be for example a hydroxyl group, an amino group, a carbonyl group, a carboxylic acid group or a salt thereof, a sulfhydryl group, a phosphoric acid group or a salt thereof, or a combination thereof; for example a hydroxyl group. The organic ligand having the hydrophilic functional group may include for example a substituted or unsubstituted mercaptoalcohol, for example a substituted or unsubstituted mercaptomethanol, a substituted or unsubstituted mercaptoethanol, a substituted or unsubstituted mercaptopropanol, a substituted or unsubstituted mercaptobutanol, a substituted or unsubstituted mercaptopentanol, a substituted or unsubstituted mercaptohexanol, a substituted or unsubstituted mercaptoheptanol, a substituted or unsubstituted mercaptooctanol, a substituted or unsubstituted mercaptononanol, a substituted or unsubstituted mercaptodecanol, a substituted or unsubstituted mercaptoundecanol, a substituted or unsubstituted mercaptododecanol, a substituted or unsubstituted mercaptotridecanol, a substituted or unsubstituted mercaptoethane diol, a substituted or unsubstituted mercaptopropane diol, a substituted or unsubstituted mercaptobutane diol, a substituted or unsubstituted mercaptopentane diol, or a combination thereof. Herein "substituted" refers to replacement of at least one hydrogen by a C1 to 010 alkyl group. The hydrophilic solvent may be for example a solvent having a polarity index of greater than or equal to about 5.0, and may include for example water, alcohol, acetonitrile, dimethyl formamide, or a combination thereof, for example an alcohol such as ethanol, isopropyl alcohol, and the like.

For example, the forming of the hole auxiliary layer 13 may include coating a hole auxiliary solution on a surface of the anode or the hole injection layer and drying the same, wherein the hole auxiliary solution may be a hydrophobic solution and the hole auxiliary solution may include a hydrophobic solvent in which a hole transport material, an electron blocking material, or a combination thereof may be dispersible or soluble. The hole transport material and the electron blocking material may include for example poly(9,9-dioctyl-fluorene-co-N-(4-butylphenyl)-diphenylamine) (TFB), poly(arylamine), poly(N-vinylcarbazole), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), p-type metal oxide (e.g., NiO, $WO_3$, $MoO_3$, etc.), p-type metal sulfide (e.g., ZnS), a carbonaceous material such as graphene oxide, and a combination thereof, and the hydrophobic solvent may include for example hexane, diethyl ether, methylene chloride, benzene, toluene, xylene, chloroform, octane, nonane, cyclohexane, acetone, or a combination thereof, but are not limited thereto.

For example, the forming of the electron auxiliary layer 15 may include coating an electron auxiliary solution on the quantum dot layer and drying the same, wherein the electron auxiliary solution may be a hydrophobic solution and the electron auxiliary solution may include a hydrophobic solvent in which an electron transport material may be dispersible or soluble. The electron transport material may include for example 1,4,5,8-naphthalene-tetracarboxylic dianhydride (NTCDA), bathocuproine (BCP), tris[3-(3-pyridyl)-mesityl] borane (3TPYMB), LiF, Alq3, Gaq3, Inq3, Znq2, Zn(BTZ)2, BeBq2, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), and a combination thereof. The hydrophobic solvent may include for example hexane, diethyl ether, methylene chloride, benzene, toluene, xylene, chloroform, octane, nonane, cyclohexane, acetone, or a combination thereof, but is not limited thereto.

In this way, since the quantum dot layer 14, the hole auxiliary layer 13 under the quantum dot layer 14, and the electron auxiliary layer 15 on the quantum dot layer 14 are respectively formed in a solution process, wherein the quantum dot layer 14 is formed by using a hydrophilic solution including a quantum dot substituted with an organic ligand having a hydrophilic functional group and a hydrophilic solvent, while the hole auxiliary layer 13 and/or the electron auxiliary layer 15 is formed by using a hydrophobic solution, each layer is prevented from being swollen or mixed and even dissolved and removed due to miscibility of the solvents of the adjacent layers during formation of a next layer after forming one layer. Accordingly, photoluminescence characteristics and electrical characteristics of the quantum dot device formed by using the solution process may be prevented from deformation, but photoluminescence characteristics and electrical characteristics thereof may be improved.

The quantum dot device may be for example applied to various electronic devices such as display devices or lighting devices, and the like.

Hereinafter, the embodiments of the present disclosure are illustrated in more detail with reference to examples. However, these examples are exemplary, and the present disclosure is not limited thereto.

EXAMPLES

Synthesis Example I: Synthesis of Core-Shell Quantum Dot

Synthesis Example 1: Synthesis of InP—ZnSeS Core-Shell Quantum Dot

Preparation of InP Core 0.4 millimoles (mmol) of indium acetate, 1.2 mmol of palmitic acid, and 10 milliliters (mL) of trioctylamine are put in a reactor and heated at 120° C. under vacuum. After 1 hour, an atmosphere in the reactor is converted into nitrogen. The reactor is heated at 280° C., a tris(trimethylsilyl)phosphine (TMS3P, 0.2 mmol) solution is rapidly injected thereinto, and the mixture is reacted for a predetermined time. A final solution obtained therefrom is rapidly cooled to room temperature (24° C.), acetone is added thereto, and a precipitate formed therein is centrifuged and then dispersed in toluene to obtain InP quantum dots.

Preparation of InP—ZnSeS Core-Shell Quantum Dot 0.9 mmol of zinc acetate, 1.8 mmol of oleic acid, and 10 mL of trioctylamine are put in a reactor and vacuum-treated at 120° C. for 10 minutes. Nitrogen is used for substitution inside the reactor, and the reactor is heated up to 280° C. A toluene dispersion of the InP quantum dot synthesized above having an optical density (OD) of first excitonic absorption of 0.45 is rapidly added thereto, 0.6 mmol of selenium dispersed in trioctylphosphine (Se/TOP) and 2.0 mmol of sulfur dispersed in trioctylphosphine (S/TOP) are added thereto, and the obtained mixture is reacted for 120 minutes to obtain a reaction solution (crude). When the reaction is complete, the resultant is rapidly cooled to room temperature (24° C.), ethanol is added thereto to form a precipitate, and the precipitate is centrifuged and then, redispersed in octane to obtain an InP—ZnSeS core-shell quantum dot solution surface-treated with oleic acid (OA).

The obtained quantum dot has a photoluminescence (PL) light emitting peak at a lambda-maximum wavelength of 629 nm, a full width at half maximum (FWHM) of 34 nm, and a quantum yield (QY) of 92.8%.

Synthesis Example 2: Synthesis of ZnTeSe—ZnSeS Core-Shell Quantum Dot

Preparation of ZnTeSe Core

Selenium and tellurium are dispersed in trioctylphosphine (TOP) to obtain a 2 M Se(Te)/TOP stock solution. On the other hand, a trioctylamine solution including 0.125 mmol of a zinc acetate and 0.25 mmol of palmitic acid is prepared in a 400 mL reaction flask. The solution is heated under vacuum at 120° C. After one hour, an atmosphere in the reactor is converted into nitrogen. Subsequently, the reactor is heated up to 300° C., the above Se(Te)/TOP stock solution is rapidly injected thereinto, and the obtained mixture is reacted for 1 hour. When the reaction is complete, the reaction solution is cooled to room temperature (24° C.), acetone is added thereto, and a precipitate formed therein is centrifuged and dispersed to obtain a ZnTeSe quantum dot. Preparation of ZnTeSe—ZnSeS Core-Shell Quantum Dot 0.9 mmol of zinc acetate, 1.8 mmol of oleic acid, and 10 mL of trioctylamine are put in a reactor and then, vacuum-treated at 120° C. for 10 minutes. Nitrogen is used for substitution inside the reactor, and the reactor is heated up to 280° C. A toluene dispersion of the ZnTeSe quantum dot prepared above with an optical density (OD) of first excitonic absorption of 0.45 is added thereto, and within 10 seconds, 0.6 mmol of Se/TOP and 2.0 mmol of S/TOP are added thereto, and the obtained mixture is reacted for 120 minutes to obtain a reaction solution (crude). When the reaction is complete, the resultant is rapidly cooled to room temperature (24° C.), ethanol is added thereto, and a precipitate formed therein is centrifuged and then, redispersed in cyclohexane to obtain a ZnTeSe—ZnSeS core-shell quantum dot solution.

The obtained quantum dot has a PL light emitting peak at a lambda-maximum wavelength of 455 nm, a full width at half maximum (FWHM) of 29 nm, and a quantum yield (QY) of 65%.

Synthesis Example II: Synthesis of Quantum Dot Substituted with Organic Ligand

Synthesis Example 3

The InP—ZnSeS core-shell quantum dot solution according to Synthesis Example 1 is additionally twice washed and dispersed in cyclohexane having the same volume as the quantum dot solution. Subsequently, 250 µL of mercaptohexanol (MCH) is added thereto, while the quantum dot solution dispersed in 5 mL of cyclohexane is stirred with a magnetic bar on a hot plate set at 60° C. Then, 5 mL of ethanol is added thereto, the obtained mixture is reacted for 30 minutes, twice cleaned through centrifugation, and dispersed in an alcohol solution having the same volume to obtain an InP—ZnSeS core-shell quantum dot substituted with mercaptohexanol.

Synthesis Example 4

A ZnTeSe—ZnSeS core-shell quantum dot substituted with mercaptohexanol is obtained according to the same method as Synthesis Example 3 except for using the ZnTeSe—ZnSeS core-shell quantum dot according to Synthesis Example 2 instead of the InP—ZnSeS core-shell quantum dot solution according to Synthesis Example 1.

Synthesis Example 5

The InP—ZnSeS core-shell quantum dot solution according to Synthesis Example 1 is additionally twice washed and then, dispersed in cyclohexane having the same volume. Subsequently, 400 mg of mercaptoundecanol (MCU) is added thereto, while the quantum dot solution dispersed in 5 mL of cyclohexane is stirred with a magnetic bar on a hot plate set at 60° C. Subsequently, 5 mL of ethanol is added thereto, the obtained mixture is reacted for 30 minutes, twice cleaned through centrifugation, and then, dispersed in an alcohol solution having the same volume to obtain an InP—ZnSeS core-shell quantum dot substituted with mercaptoundecanol.

Synthesis Example 6

A ZnTeSe—ZnSeS core-shell quantum dot substituted with mercaptoundecanol is obtained according to the same method as Synthesis Example 5 except for using the ZnTeSe—ZnSeS core-shell quantum dot according to Synthesis Example 2 instead of the InP—ZnSeS core-shell quantum dot solution according to Synthesis Example 1.

Manufacture of Quantum Dot Device

Example 1

A glass substrate deposited with ITO (WF: 4.8 eV) is surface-treated with an UV-ozone combination for 15 minutes, spin-coated with a PEDOT:PSS solution (H.C. Starks Co., Ltd.), and heat-treated under the ambient air atmosphere at 150° C. for 10 minutes and then, under an $N_2$ atmosphere at 150° C. for 10 minutes to form a hole injection layer having a thickness of 45 nm. On the hole injection layer, a hole transport layer having a thickness of 25 nm is formed thereon by dissolving poly(9,9-dioctyl-fluorene-co-N-(4-butylphenyl)-diphenylamine) (TFB, Sumitomo Corp.) in a concentration of 0.7 weight percent (wt %) in xylene, spin-coating the solution onto the hole injection layer at about 2000 rpm, and heat-treating the same at 150° C. for 30 minutes. On the hole transport layer, a quantum dot layer is formed thereon by spin-coating the ZnTeSe—ZnSeS core-shell quantum dot solution according to Synthesis Example 4 and heat-treating the solution at 80° C. for 30 minutes. On the quantum dot layer, an electron transport layer having a thickness of 36 nm is formed thereon by vacuum-depositing a host material (NET430, Novaled GmbH) and a dopant (NDN77, Novaled GmbH) (hereinafter the combination of host and dopant is referred to as NET430:NDN77), and a cathode is formed thereon by vacuum-depositing aluminum (Al) to a thickness of 90 nm, resultantly manufacturing a quantum dot device.

Example 2

A quantum dot device is manufactured according to the same method as Example 1 except for using the ZnTeSe—ZnSeS core-shell quantum dot substituted with mercaptoundecanol according to Synthesis Example 6 instead of the ZnTeSe—ZnSeS core-shell quantum dot substituted with mercaptohexanol according to Synthesis Example 4.

Example 3

A thick hole injection layer having a thickness of 45 nm is formed by surface-treating a glass substrate deposited with ITO (WF: 4.8 eV) with a UV-ozone combination for 15 minutes, spin-coating a PEDOT:PSS solution (H.C. Starks Co., Ltd.) thereon, and heat-treating it under the ambient air atmosphere at 150° C. for 10 minutes and then under a $N_2$ atmosphere at 150° C. for 10 minutes. On the hole injection layer, a hole transport layer having a thickness of 25 nm is formed by dissolving poly(N-vinylcarbazole) (PVK, Lumtec Technology Corp.) in a concentration of 0.7 wt % in toluene, spin-coating the solution, and heat-treating it at 150° C. for 30 minutes. On the hole transport layer, a quantum dot layer is formed by spin-coating the ZnTeSe—ZnSeS core-shell quantum dot substituted with mercaptohexanol according to Synthesis Example 4 and heat-treating it at 80° C. for 30 minutes. On the quantum dot layer, an electron transport layer having a thickness of 36 nm is formed by vacuum-depositing NET430:NDN77 (Novaled GmbH), and a cathode is formed thereon by vacuum-depositing aluminum (Al) to a thickness of 90 nm, resultantly manufacturing a quantum dot device.

Example 4

A quantum dot device is manufactured according to the same method as Example 3 except for using the ZnTeSe—ZnSeS core-shell quantum dot substituted with mercaptoundecanol according to Synthesis Example 6 instead of the ZnTeSe—ZnSeS core-shell quantum dot substituted with mercaptohexanol according to Synthesis Example 4.

Example 5

A hole injection layer having a thickness of 45 nm is formed by surface-treating a glass substrate deposited with ITO (WF: 4.8 eV) with a UV-ozone combination for 15 minutes, spin-coating a PEDOT:PSS solution (H.C. Starks Co., Ltd.) and heat-treating it under the air atmosphere at 150° C. for 10 minutes and then, under a N$_2$ atmosphere at 150° C. for 10 minutes. On the hole injection layer, ZnS (average particle size of 3 to 5 nm, 2 wt % based on the total weight of octane) dispersed in octane is spin-coated at 4500 rpm and heat-treated at 80° C. for 30 minutes to form an electron blocking layer having a thickness of 5 nm. On the electron blocking film, a quantum dot layer is formed by spin-coating the ZnTeSe—ZnSeS core-shell quantum dot substituted with mercaptohexanol according to Synthesis Example 4 and heat-treating it at 80° C. for 30 minutes. On the quantum dot layer, an electron transport layer having a thickness of 36 nm is formed by vacuum-depositing NET430:NDN77 (Novaled GmbH), and a cathode is formed thereon by vacuum-depositing aluminum (Al) to a thickness of 90 nm, manufacturing a quantum dot device.

Example 6

A quantum dot device is manufactured according to the same method as Example 5 except for using the ZnTeSe—ZnSeS core-shell quantum dot according to Synthesis Example 6 substituted with mercaptoundecanol instead of the ZnTeSe—ZnSeS core-shell quantum dot substituted with mercaptohexanol according to Synthesis Example 4.

Example 7

A quantum dot device is manufactured according to the same method as Example 5 except for forming an electron blocking layer having a thickness of 10 nm.

Example 8

A quantum dot device is manufactured according to the same method as Example 6 except for forming an electron blocking layer having a thickness of 10 nm.

Example 9

A hole injection layer having a thickness of 45 nm is formed by surface-treating a glass substrate deposited with ITO (WF: 4.8 eV) with a UV-ozone combination for 15 minutes, spin-coating a PEDOT:PSS solution (H.C. Starks Co., Ltd.), and then, heat-treating it under the ambient air atmosphere at 150° C. for 10 minutes and under a N$_2$ atmosphere at 150° C. for 10 minutes. On the hole injection layer, a hole transport layer having a thickness of 25 nm is formed by dissolving poly(N-vinylcarbazole) (PVK, Lumtec Technology Corp.) in a concentration of 0.7 wt % in toluene, spin-coating the solution, and heat-treating it at 150° C. for 30 minutes. On the hole transport layer, an electron blocking layer having a thickness of 5 nm is formed by spin-coating ZnS (average particle size of 3 to 5 nm, 2 wt % in octane) dispersed in octane and heat-treating it at 4500 rpm at 80° C. for 30 minutes. On the electron blocking layer, a quantum dot layer is formed by spin-coating the ZnTeSe—ZnSeS core-shell quantum dot substituted with mercaptohexanol according to Synthesis Example 4 and heat-treating it at 150° C. for 30 minutes. On the quantum dot layer, an electron transport layer having a thickness of 36 nm is formed by vacuum-depositing NET430:NDN77 (Novaled GmbH), and a cathode is formed thereon by vacuum-depositing aluminum (Al) to a thickness of 90 nm, resultantly manufacturing a quantum dot device.

Evaluation

Evaluation I

The average surface roughness (RMS) of each quantum dot layer in the quantum dot devices according to Examples 1 and 2 is evaluated.

The results are shown in Table 1.

TABLE 1

| | Average surface roughness (RMS) |
|---|---|
| Example 1 | 3.16 nm |
| Example 2 | 2.42 nm |

Referring to Table 1, the quantum dot layers of the quantum dot devices according to Examples 1 and 2 show relatively uniform surface roughness.

Evaluation II

Current-voltage-luminescence characteristics of the quantum dot devices according to the Examples are evaluated.

The current-voltage-luminescence characteristics are evaluated by using a Keithley 220 current source and a Minolta CS200 spectroradiometer.

The results are shown in Table 2.

TABLE 2

| | $EQE_{max}$ (%) | Maximum Current Efficiency (Cd/A) | Luminance (Cd/m$^2$) | $\lambda_{max}$ (nm) |
|---|---|---|---|---|
| Example 1 | 5.4 | 4.1 | 164 | 456 |
| Example 2 | 2.7 | 2.2 | 107 | 457 |
| Example 3 | 7.2 | 5.0 | 135 | 456 |
| Example 4 | 2.6 | 1.9 | 76 | 456 |
| Example 5 | 4.3 | 3.1 | 148 | 457 |
| Example 6 | 2.4 | 1.7 | 81 | 457 |
| Example 7 | 3.3 | 2.2 | 97 | 456 |
| Example 8 | 2.7 | 1.7 | 81 | 456 |
| Example 9 | 5.9 | 4.3 | 125 | 458 |

In Table 2, $EQE_{max}$ is the maximum external quantum efficiency, maximum current efficiency is reported as candela (Cd) per ampere (A), luminance is reported as candela (Cd) per square meter ($m^2$) and is measured at a current of 5 milliamperes (mA), and $\lambda_{max}$ is the wavelength with the greatest emission of light.

Referring to Table 2, the quantum dot devices of the Examples show sufficient current-voltage-luminescence characteristics.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot device, comprising
a first electrode and a second electrode facing each other,
a quantum dot layer disposed between the first electrode and the second electrode and comprising a plurality of quantum dots,
a first charge auxiliary layer disposed between the first electrode and the quantum dot layer, the first charge auxiliary layer contacting the quantum dot layer, and
a second charge auxiliary layer disposed between the second electrode and the quantum dot layer, the second charge auxiliary layer contacting the quantum dot layer,
wherein the plurality of quantum dots comprises a quantum dot comprising an organic ligand on a surface thereof, the organic ligand comprising a hydrophilic functional group at a terminal end,
wherein the organic ligand is represented by Chemical Formula 1:

   Chemical Formula 1 wherein, in Chemical Formula 1,
M is a moiety coordination-bonded with the quantum dot,
each L is the same or different, and is a substituted or unsubstituted C1 to C30 linear or branched alkylene group, a substituted or unsubstituted C2 to C30 linear or branched alkenylene group, a substituted or unsubstituted C2 to C30 linear or branched alkynylene group, or a combination thereof,
each X is the same or different, and is the hydrophilic functional group comprising a hydroxyl group, an amino group, a carbonyl group, a carboxylic acid group or a salt thereof, a sulfhydryl group, or a phosphoric acid group or a salt thereof,
n is an integer ranging from 1 to 3, and
* is a bonding point with the quantum dot.

2. The quantum dot device of claim 1, wherein the hydrophilic functional group comprises a hydroxyl group, a sulfhydryl group, or a combination thereof.

3. The quantum dot device of claim 1, wherein the M of Chemical Formula 1 comprises a moiety derived from SH, COOH, COO, $NH_2$, NH, N, $H_2PO$, HPO, PO, $H_2P$, HP, P, OH, $PO(OH)_2$, POOH, or a combination thereof.

4. The quantum dot device of claim 1, wherein the organic ligand is a substituted or unsubstituted organic ligand that comprises a substituted or unsubstituted mercaptomethanol, a substituted or unsubstituted mercaptoethanol, a substituted or unsubstituted mercaptopropanol, a substituted or unsubstituted mercaptobutanol, a substituted or unsubstituted mercaptopentanol, a substituted or unsubstituted mercaptohexanol, a substituted or unsubstituted mercaptoheptanol, a substituted or unsubstituted mercaptooctanol, a substituted or unsubstituted mercaptononanol, a substituted or unsubstituted mercaptodecanol, a substituted or unsubstituted mercaptoundecanol, a substituted or unsubstituted mercaptododecanol, a substituted or unsubstituted mercaptotridecanol, a substituted or unsubstituted mercaptoethane diol, a substituted or unsubstituted mercaptopropane diol, a substituted or unsubstituted mercaptobutane diol, a substituted or unsubstituted mercaptopentane diol, or a combination thereof,
wherein at least one hydrogen of the substituted organic ligand is substituted by a C1 to C10 alkyl group.

5. The quantum dot device of claim 1, wherein an average surface roughness of the quantum dot layer is less than or equal to about 4 nanometers.

6. The quantum dot device of claim 1, wherein the first charge auxiliary layer comprises a hole transport material, an electron blocking material, or a combination thereof, and
wherein the hole transport material and the electron blocking material are each independently dispersible or soluble in a hydrophobic solvent.

7. The quantum dot device of claim 1, wherein the second charge auxiliary layer comprises an electron transport material that is dispersible in a hydrophobic solvent.

8. The quantum dot device of claim 7, wherein the electron transport material comprises a low molecular weight organic compound, a polymer, an inorganic material, or a combination thereof.

9. The quantum dot device of claim 1, further comprising a first charge injection layer disposed between the first electrode and the first charge auxiliary layer.

10. The quantum dot device of claim 1, further comprising a second charge injection layer disposed between the second electrode and the second charge auxiliary layer.

11. The quantum dot device of claim 1, wherein the first charge auxiliary layer is a hole transport layer, an electron blocking layer, or a combination thereof; and
the second charge auxiliary layer is an electron transport layer.

12. A method of manufacturing a quantum dot device, comprising
forming a first electrode,
forming a first charge auxiliary layer on the first electrode,
forming a quantum dot layer on the first charge auxiliary layer,
forming a second charge auxiliary layer on the quantum dot layer, and
forming a second electrode on the second charge auxiliary layer,
wherein the forming of the quantum dot layer comprises coating a quantum dot solution on a surface of the first charge auxiliary layer, the quantum dot solution comprising
a quantum dot comprising an organic ligand on a surface thereof, the organic ligand comprising a hydrophilic functional group at a terminal end; and
a hydrophilic solvent.

13. The method of claim 12, wherein the hydrophilic functional group comprises a hydroxyl group, an amino group, a carbonyl group, a carboxylic acid group or a salt thereof, a sulfhydryl group, a phosphoric acid group or a salt thereof, or a combination thereof.

14. The method of claim 12, wherein the hydrophilic solvent comprises a solvent comprising a polarity index of greater than or equal to about 5.0.

15. The method of claim 12, wherein the hydrophilic solvent comprises water, alcohol, acetonitrile, dimethyl formamide, or a combination thereof.

16. The method of claim 12, wherein the forming of the first charge auxiliary layer comprises coating a first charge auxiliary solution on a surface of the first electrode,
   wherein the first charge auxiliary solution comprises
      a hydrophobic solvent; and
      a hole transport material, an electron blocking material, or a combination thereof,
   wherein the hole transport material and the electron blocking material are each independently dispersible or soluble in the hydrophobic solvent.

17. The method of claim 16, wherein the hydrophobic solvent comprises hexane, diethyl ether, methylene chloride, benzene, toluene, xylene, chloroform, octane, nonane, cyclohexane, acetone, or a combination thereof.

18. The method of claim 12, wherein the forming of the second charge auxiliary layer comprises coating a second charge auxiliary solution on a surface of the quantum dot layer,
   wherein the second charge auxiliary solution comprises
      a hydrophobic solvent; and
      an electron transport material that is dispersible or soluble in the hydrophobic solvent.

19. The method of claim 18, wherein the hydrophobic solvent comprises hexane, diethyl ether, methylene chloride, benzene, toluene, xylene, chloroform, octane, nonane, cyclohexane, acetone, or a combination thereof.

20. An electronic device comprising the quantum dot device of claim 1.

* * * * *